(12) United States Patent
Spencer

(10) Patent No.: US 7,227,462 B2
(45) Date of Patent: Jun. 5, 2007

(54) EXTREMELY FAST POLLING METHOD FOR DETERMINING THE PRESENCE OF INDIVIDUAL ELECTRIC METERS ON A POWER LINE

(76) Inventor: Quentin Spencer, 11549 Tivoli, St. Louis, MO (US) 63146

( * ) Notice: Subject to any disclaimer, the term of this patent is extended or adjusted under 35 U.S.C. 154(b) by 199 days.

(21) Appl. No.: 11/075,506

(22) Filed: Mar. 9, 2005

(65) Prior Publication Data

US 2006/0202854 A1    Sep. 14, 2006

(51) Int. Cl.
*H04Q 1/30* (2006.01)
(52) U.S. Cl. ............... 340/538; 340/310.11; 340/3.51
(58) Field of Classification Search ............... 340/538, 340/870.02, 310.18, 3.51, 310.11, 538.11; 307/3; 375/259
See application file for complete search history.

(56) References Cited

U.S. PATENT DOCUMENTS

| | | | | |
|---|---|---|---|---|
| 3,944,723 A | * | 3/1976 | Fong .......................... 178/3 |
| 4,446,462 A | * | 5/1984 | Ouellette et al. ........... 340/3.51 |
| 4,559,520 A | * | 12/1985 | Johnston .................... 370/203 |
| 5,315,531 A | | 5/1994 | Oravetz |
| 5,384,712 A | | 1/1995 | Oravetz |
| 5,491,463 A | * | 2/1996 | Sargeant et al. ........ 340/310.16 |
| 5,553,094 A | * | 9/1996 | Johnson et al. ............. 375/130 |
| 5,903,594 A | | 5/1999 | Saulnier |
| 5,940,009 A | | 8/1999 | Loy |
| 6,195,018 B1 | * | 2/2001 | Ragle et al. ............ 340/870.01 |
| 6,278,357 B1 | * | 8/2001 | Croushore et al. ........... 375/259 |
| 6,351,223 B1 | * | 2/2002 | DeWeerd et al. ...... 340/870.03 |
| 6,710,721 B1 | | 3/2004 | Holowick |

\* cited by examiner

*Primary Examiner*—Phung T. Nguyen
(74) *Attorney, Agent, or Firm*—Polster, Lieder, Woodruff & Lucchesi, L.C.

(57) ABSTRACT

A "super-fast" polling method for electrical meters for outage detection. In response to a query, a large group of electric meters (M) all simultaneously transmit reply signals over an electrical distribution network using TWACS®. The signals are separated by an inbound detector (IB) at a receiving end of the network. This allows a very large number of meters to be polled in a very short period of time to determine whether or not an outage has occurred at the location of each meter. Each meter transmits a bit pattern, and bit patterns are designed so a group of meter units can transmit their patterns simultaneously over a power line (L) to the inbound detector. The presence or absence of a bit pattern in the received signal conveys the presence or absence of the associated meter in the system. The ability to transmit multiple bit patterns in parallel requires that they be orthogonal to each other. The Hadamard matrices are a class of matrices whose rows could be used as a set of bit patterns.

In addition to super-fast polling for outage detection, the method of the invention can also be used to poll meters for the presence of an alarm condition, as well as for both outage detection and an alarm condition.

23 Claims, 2 Drawing Sheets

EXTREMELY FAST POLLING METHOD FOR DETERMINING THE PRESENCE OF INDIVIDUAL ELECTRIC METERS ON A POWER LINE

CROSS REFERENCE TO RELATED APPLICATIONS

None

STATEMENT REGARDING FEDERALLY SPONSORED RESEARCH OR DEVELOPMENT

N/A

BACKGROUND OF THE INVENTION

This invention is directed to communications over an electrical distribution network or the like, employing a communications system known as TWACS®, and more particularly, to a very rapid polling system for use in the detection and mapping of power outages.

Efficient outage detection and mapping is an important concern of electric utilities. In situations where a power outage occurs, the utility needs to quickly find out a) that an outage has occurred, b) where the outage has occurred, and c) the extent of the outage. This enables the utility to then marshal and direct the resources necessary to correct the outage and restore power in the shortest possible time.

Using current TWACS protocols to determine the presence or absence of an individual meter on the network requires both an outbound command and an inbound response which currently includes a minimum of 3 bytes of information. While a reasonable level of outage mapping is obtainable at this relatively slow polling rate (by carefully selecting a subset of meters on different buses, feeders, and phases), it would be beneficial to have an alternate means of polling all the units on a substation, in order to locate even very small outages (i.e., a single meter) in a very short period of time. It would be particularly helpful, given the size of many distribution networks, to be able to poll a group of which included thousand of meters on the order of 1-2 minutes.

One possible solution to this problem would be to have each meter in a group sequentially respond to a poll command. This would require a message length of only one or two pulses per meter to achieve a desired polling rate. By having a very large group of meters sequentially respond to a single outbound command, this would minimize the overhead of outbound commands, and meters could be polled at a rate of approximately nearly 1 pulse for each half-cycle of the 60 Hz waveform.

A problem with this approach is the reliable detection of the pulse(s) in the high noise environment of a power line. One way to overcome this difficulty would be to increase the power of the pulses transmitted by each meter. But this would mean overriding the pre-set firing angle established within the TWACS to generate the much stronger current pulse. This, in turn, creates the additional problem of increasing the stress on the electronics in the meter. It is also unclear as to how large a current pulse could be generated before reaching the saturation point in a service transformer, and the other effects this would have on the power line local to that transformer.

BRIEF SUMMARY OF THE INVENTION

The method of the invention is directed to providing outage detection and mapping capabilities to an electrical or other utility. The method employs a "super fast" polling system which, for an electrical utility, means that a high polling rate is achieved utilizing a system in which a group of electric meters located at people's houses, commercial, manufacturing, and other establishments, all simultaneously transmit signals over an electrical distribution network using TWACS®. The signals are designed such that they can be separated at the receiving end of the distribution network. As a result, a very large number of electrical meters can be polled in a very short period of time to determine whether or not an outage has occurred at the location of each meter.

In accordance with the method, each meter transmits a longer bit pattern than the 1 or 2 bit patterns discussed above, and the bit patterns are designed so a group of meters can transmit their patterns simultaneously over a power line and the inbound detector for that line can readily determine which meters are present. There is some flexibility in designing bit patterns since the bits themselves do not convey information; rather, the presence or absence of a bit pattern conveys the presence or absence of a meter. For a message of N bits in length, if there is a set of N non-interfering patterns, the system can achieve the same polling rate as if only 1 bit per unit were used. Preferably, orthogonal bit patterns of the type used with Hadamard matrices are employed.

This method of the invention employs code-division multiplexing similar to code division multiple access (CDMA) schemes employed in digital cellular telephone systems. An important advantage of the method of the invention is that by using a long bit pattern known in advance, a receiver can detect presence of the bit pattern with high reliability. This is because the affect of any noise can be averaged noise over the length of the message. Accordingly, reliability increases as message length increases.

If the polling method of the invention were used on all available inbound TWACS channels simultaneously, a polling rate of 6 units per 8 half cycles would be achieved. On a 60 Hz power distribution network, this results in an overall polling rate of 90 meters per second (5400 meters per minute).

In addition to super-fast polling for outage detection, the method of the invention can also be used to poll meters for the presence of an alarm condition, as well as for both outage detection and an alarm condition.

Other objects and features will be in part apparent and in part pointed out hereinafter.

BRIEF DESCRIPTION OF THE SEVERAL VIEWS OF THE DRAWINGS

The objects of the invention are achieved as set forth in the illustrative embodiments shown in the drawings which form a part of the specification.

Corresponding reference characters indicate corresponding parts throughout the several views of the drawings.

DETAILED DESCRIPTION OF INVENTION

The following detailed description illustrates the invention by way of example and not by way of limitation. This description will clearly enable one skilled in the art to make and use the invention, and describes several embodiments, adaptations, variations, alternatives and uses of the invention, including what I presently believe is the best mode of carrying out the invention. As various changes could be made in the above constructions without departing from the scope of the invention, it is intended that all matter contained in the above description or shown in the accompanying drawings shall be interpreted as illustrative and not in a limiting sense.

Figure 1:
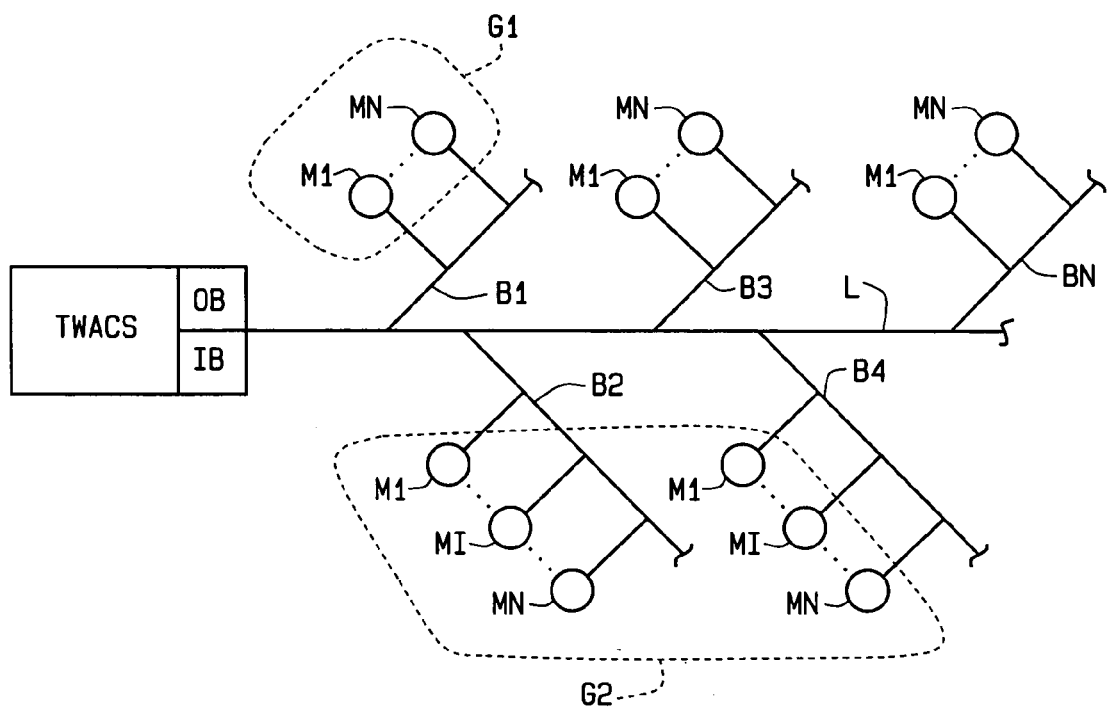
FIG. 1 is a simplified representation of an electrical power systems communications network.

FIG. 1 is a simplified representation of a TWACS communications network for communicating with electrical meters M installed on various branches B1-Bn of a power line L. The communications system includes an outbound signaling transmitter OB by which signals are transmitted over the power lines to the meters, and an inbound signal detector IB for receiving and processing responses to the outbound signals. For a three-phase electrical distribution system, there are up to six (6) communication channels available for sending and receiving TWACS communications.

Each branch off of transmission line L services a number of establishments each of which has one or more meters associated with it. Accordingly, each line has meters M1-Mn monitoring electrical usage at that site and communicating with through TWACS about electrical usage at the site. Each meter further has the capability of being periodically polled to supply various information about electrical usage, including whether or not there is a power outage at that location. Heretofore, this information has been provided using a relatively short bit pattern; sometimes only one or two bits in addition to an address bit by which each meter is uniquely identified. Providing outage information is important for the reasons previously discussed as to determining if there is an outage, and if so, its location and extent. As also previously discussed, it is advantageous if a group of meters can be polled simultaneously. For example, a group G1 of meters on one branch could be simultaneously polled, or a group G2 of meters including those on more than one branch could be simultaneously polled. The particular configuration for a group is a function of a number of factors not relevant to the present invention.

In accordance with the method of the present invention, meters M will now transmit a significantly longer bit pattern in response to a query signal transmitted by outbound transmitter OB to the meters. However, the patterns are designed so each group of meters will transmit patterns simultaneously on line L with inbound detector IB determining which meters are present and which are not. The absence of a response from a meter is indicative of a power outage at that location. For use in high speed polling, it is important that the bit patterns be determined in advance. Further, for power outage detection, only information conveyed by each pattern is the presence or absence of a meter M in the group of meters polled. Importantly, for a message N bits in length (16 bits, for example), if a set of N non-interfering bit patterns can be identified, the system can achieve the same polling rate as if only 1 bit per meter were used.

The high speed polling method of the invention employs a code division multiplexing scheme for the received and processed inbound signals. This is advantageous in that since the bit pattern is known in advance, inbound signal detector IB can detect the presence of the bit pattern with high reliability because the presence of any line noise is averaged over the length of the message. And, this reliability increases as message length increases. By using all six of the available inbound channels simultaneously, a polling rate of 6 units per 8 half cycles is achievable. If the normal message transmission elements (address bytes, etc.) for outbound signals are ignored, a polling rate of 90 meters M per second (5400 meters per minute) is theoretically possible. Those skilled in the art will understand that the actual rate achieved is somewhat less than this maximum, the actual polling rate being dependent upon how large a group of meters M can be polled using a single outbound command.

The bit patterns comprising the reply signals sent by the polled meters employ orthogonal bit patterns. To understand how orthogonal bit patterns are used in the method of the present invention, it will first be understood that logical 1s and 0s in an inbound signal transmitted by a meter M are produced as an output of an inbound detector IB as a 1, or −1, plus noise. A decision is then made by the inbound signal processor as to whether the matrix value assigned to each output shall be 1, or −1. For determining the presence or absence of a meter M, the resulting matrix will consist of 1 or −1, and will have the property that all rows are orthogonal to each other. Hadamard matrices are a class of matrices having this property.

In the following example, the rows of a 4×4 Hadamard matrix have the following bit patterns (any noise being ignored at this time):

$$H = \begin{bmatrix} 1 & 1 & 1 & 1 \\ 1 & 1 & -1 & -1 \\ 1 & -1 & 1 & -1 \\ 1 & -1 & -1 & 1 \end{bmatrix}.$$

If the first three meters M queried in accordance with the method responded, but a fourth and last meter M did not, the received reply signal would be the sum of the first three rows, or

[3 1 1 −1].

To determine the presence of the first meter M, each of the received values is multiplied by each of the transmitted values from the first row of the matrix H, and the results summed. The resulting value is 4. Repeating the process for each of the remaining rows in the matrix produces results of 4, 4, and 0, with the entire results being presented as:

[4 4 4 0].

For any row in which the total equals 4, we assume the meter M to be present, and for the row in which the total is 0, we assume the meter to be absent.

Since noise is usually present on the line, the values calculated in the above example will not be exactly 4 or 0, but should be reasonably close to 4 or 0. The actual number in each instance represents a confidence level in the particular meter being present or absent. In use, and in accordance with the method, once all of the values have been computed, they will be compared against a pre-defined threshold; for example, 2.00. This means that if the resulting value exceeds 2.00, the meter is presumed to be present, while if below 2.00, it is presumed to be absent.

Referring to the above example, assume the following noise vector

[−0.14 −0.53 0.04 0.09], which is combined with the vector

[3 1 1 −1], to produce the resulting received signal vector

[2.86 0.47 1.04 −0.91].

Correlating this vector against the transmitted bit patterns produces the resulting vector

[3.46 4.34 3.20 0.44].

By now comparing these values against a threshold of 2.00, one would presume that the first three meters are present, but that the last is absent.

It will be appreciated by those skilled in the art that choosing a threshold, which equals one-half the expected value for a meter that is present, should result in essentially an equal probability of falsely determining a unit's presence or absence. However, since, for outage detection purposes, it is more important to reliably detect the presence of a unit rather than the absence of one, it is reasonable to select threshold of a higher value. To further improve the confidence in the decision as to whether a unit is present, the method of the invention further involves the addition of a second threshold. Now, the results of the above processing provide the following results: first, definitely present; second, definitely not present; and third, unknown. Using this method, meters classified as unknown can be polled again at the end of the polling, if deemed necessary.

Figure 2:
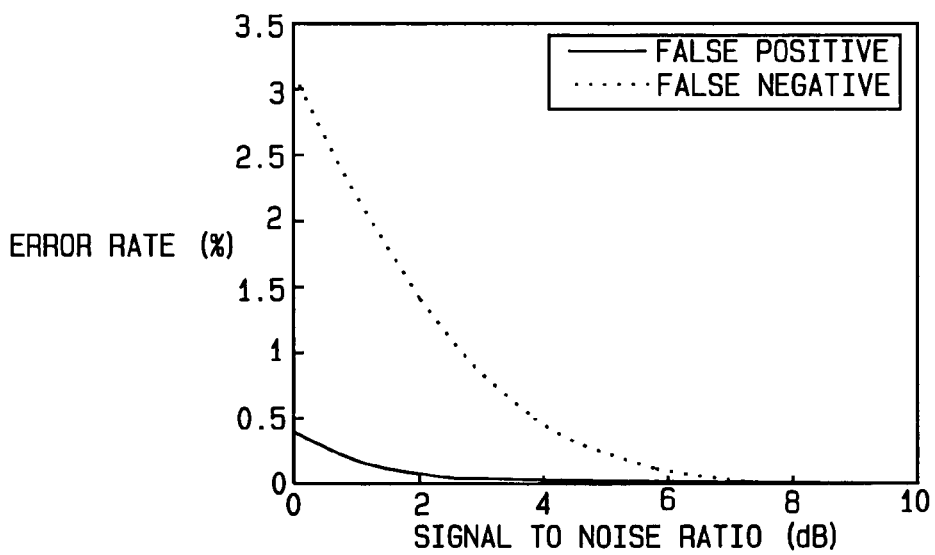
FIG. 2 is a graph representing the performance of the polling method of the presence invention as a function of the signal-to-noise (SNR) ratio for a 16-bit response; and, FIG. 3 is a histogram of pulse amplitude compared to regular TWACS inbound signal operation.

To test the super-fast polling method of the present invention, a simulation was conducted using 16-bit patterns. The patterns were taken from a 16×16 Hadamard matrix. In each instance, a random number of units varying from 0 to 16 were present. The amplitude of the signal from each meter or unit present varied randomly from 0.9 to 1.1. The signals from all units were summed together and then a noise component was added. The result was then tested over a range of signal-to-noise ratios (SNR). Received signals were correlated against transmitted bit patterns, and the results compared to a threshold of 9.6. By knowing which units were actually present, it was possible to measure the success rate of the algorithm. The results for 10,000 simulations are shown in FIG. 2. Based upon the results, it is apparent that a threshold of 9.6 minimizes false positives at the expense of an increased number of false negatives. It will be appreciated that the likelihood of either type of error can be adjusted by changing the threshold.

It will be noted that there are virtually no false positives above 4 dB, nor false negatives above 8 dB SNR. Current TWACS' systems typically require a SNR of over 8 dB to achieve a 90% reliability rate. Since TWACS' systems usually operate well above this reliability rate, it is reasonable to assume that only under rare instances will a SNR be low enough to result in significant error rates.

A concern with the high-speed polling method of the invention was how much total energy is transmitted on a line L. As noted, with normal inbound operations, there are a total of six (6) channels available, created by meters transmitting different pulse patterns. When all the channels are in use, and all the units simultaneously transmit a "1", the result is a maximum of six times the current in the first half cycle of a pulse pattern.

Figure 3:
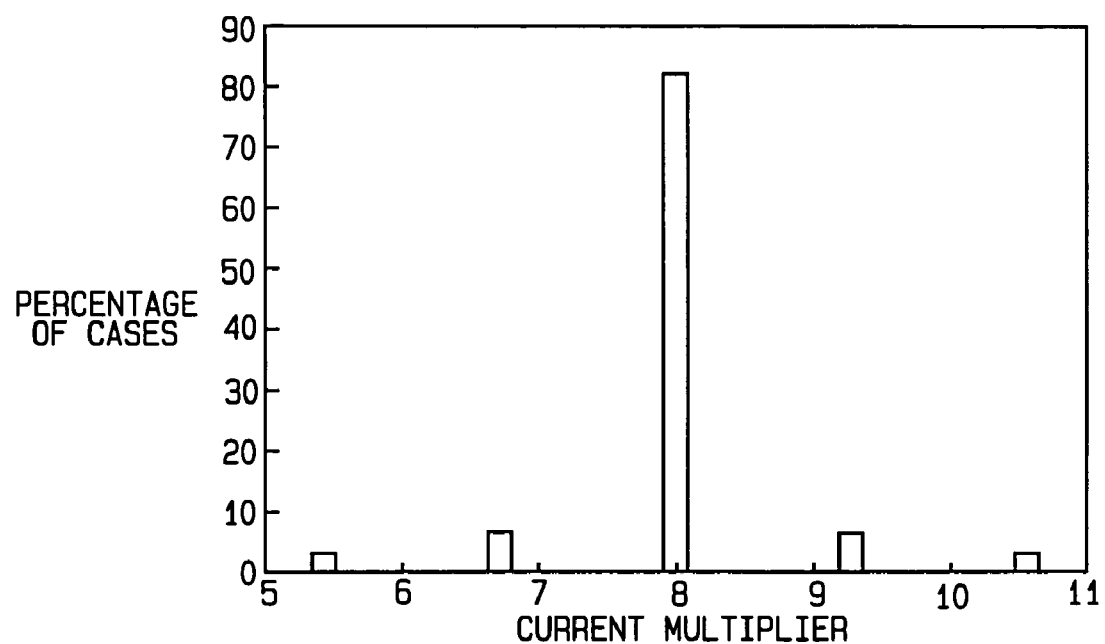

If, in accordance with the invention, a group of 96 meters, for example, is transmitting 16-bit sequences on each of the 6 channels, a significantly larger current pulse will result during each half-cycle. To determine how much larger a pulse, a simulation was conducted in which the pulse patterns were generated for this scenario. Total energy in each half cycle of the pulse was summed, and a histogram of the results is shown in FIG. 3. In FIG. 3, the "Current Multiplier" is the factor by which current is increased beyond a maximum value of 6 during regular operation of the TWACS system. From FIG. 3, it is clear that over 80% of the time, the increase is by a factor of 8, or an increase of 48 times the size of a single current pulse from one meter.

Those skilled in the art will understand that signal strength will vary from one part of the electrical distribution system to another for a variety of reasons, as will noise levels. Accordingly, the detection algorithm used by the inbound detectors IB has the capability of determining signal strength and adjusting the threshold(s) accordingly. If meter polling is done at relatively frequent intervals, it is reasonable to assume that signal and noise levels for a particular substation will vary slowly, so that maintaining a long-term average of these parameters will provide a reliable detection threshold.

Because utilities have little experience with a large number of meters simultaneously sending signals on a power line, each utility must do extensive testing when implementing the polling method of the invention to determine, for example, how many meters on a single service transformer can concurrently transmit a current pulse time the transformer's saturation point is exceeded. This is important because if non-linearities in the system are encountered, the received signal will no longer be the sum of the rows of the transmit matrix, and errors will be introduced into the detection method. Of course, one way of avoiding this problem is to select groups G of meters that do not include meters on the same service transformer in the same group.

However, even if meters are grouped so that meters on the same service transformer do not transmit at the same time, there are still issues concerning upstream effects on the summation of signals at a substation. For example, the aggregate of signals received at a substation have to have a low enough amplitude so as to not push substation transformers into non-linear behavior. Further, the summed pulses also must remain small enough so as to not cause problems for feeder-level protective relays. There is also the question of power quality. Generally, a TWACS outbound signal does not cause power quality problems because it lasts only for a short period of time and therefore is effectively a transient, rather than a steady state signal. But, by polling large groups of users in a super-fast mode in accordance with the invention, the increased signals will be continuous and may last for minutes at a time. Nonetheless, this is not expected to be a problem because the current due to outbound signaling is already substantially larger than that due to inbound signaling.

An additional issue with which utilities will have to deal is the effect of additional loading on the entire distribution system. The numbers of meters M drawing current simultaneously may place a substantial load on the system, and the utility will need to understand the total cost of the load. Thus, if the load is high enough compared to the total load on the system, it may be necessary to spread out the load over time as much as possible, subject to the utilities' polling requirements. This will require a degree of flexibility in the polling protocol so that varying polling rates at less than the maximum rate is possible.

Finally, there is the possibility of a group of meters being moved from one feeder to another. This could present problems in assigning bit patterns, and this must be taken into account.

While the above discussion has been with respect to use of a 16 bit signal and use of a 16×16 Hadamard matrix, if a set of bit patterns is chosen correctly, there can be some flexibility in changing the length of the bit patterns. For example, there are Hadamard matrices of size 32×32 having 16×16 and 8×8 subsets with orthogonal bit patterns. By constructing addressing modes and bit pattern sets to support the longest possible bit length in which a customer may be interested, the length selected by a user would then allow for trade-offs between reliability and the amount of extra energy injected into the power line.

While the primary usage of the polling method of the present invention is for outage detection, it is possible to use the method for other purposes as well.

For example, in addition to polling for the presence of meters on a power line, it is also desirable to allow meters to signal whether or not they have an alarm condition. If they do, they can be subsequently queried for more specific information. As noted previously, the presence or absence of the meter is regarded as one bit of information. An alarm condition could then be considered a second bit which could be conveyed in the super-fast polling mode by cutting the polling rate in half and allowing each meter M to transmit one of two possible bit sequences to convey the requested information. Using the same 4×4 matrix from the previous example, there would now be only two meters transmitting simultaneously. The first meter would transmit the first row of the matrix if there is no alarm condition, but the second row if it does. Similarly, the second meter would transmit either of the other two rows. Notice that in both instances, the first two bits in each row are the same but the second two bit are the inverse of each other. Thus, the bit pattern could be used to communicate the fact the meter is present, using the first half of the bit pattern, and whether or not there is an alarm condition, using the second half of the pattern.

Based upon the above, it will be understood by those skilled in the art that the polling method of the present invention could be used by a utility to poll its meters for the presence of an alarm condition rather than outage detection. In this mode of operation, a meter responds polling only if there is an alarm condition rather than if they are present.

In view of the above, it will be seen that the several objects and advantages of the present invention have been achieved and other advantageous results have been obtained.

Having thus described the invention, what is claimed and desired to be secured by Letters Patent is:

1. A method for simultaneously polling a plurality of electrical meters located at premises to which electricity is supplied through an electrical distribution system to determine the status at a location within the system comprising:
    transmitting a query signal from a transmission site over a power line to poll each meter comprising a group of meters to which a query signal is sent;
    all of the meters in the group simultaneously sending a reply signal back to the transmission site over the power line, each separate reply signal having a predetermined orthogonal bit pattern N bits in length and derived from a Hadamard matrix, the bit pattern for each meter being a unique bit pattern that is non-interfering with all of the other bit patterns sent by all of the other meters; and,
    receiving the reply signals and processing the bit patterns comprising each reply signal to determine the status at each location of a polled meter, the information conveyed by each bit pattern being the presence or absence of a response from each meter in the group of meters polled with the absence of a response from a meter indicating a power outage at the location of that meter.

2. The method of claim 1 wherein receiving and processing reply signals includes code division multiplexing, with any noise on a line over which a reply signal is sent being averaged over the length of the signal.

3. The method of claim 1 in which the presence of a polled meter is indicated by the presence of the bit pattern in the reply signal, and the absence of a polled meter is indicated by the absence of the bit pattern in the reply signal.

4. The method of claim 1 in which values in the Hadamard matrix are combined with values derived from the reply signals from the meters to generate a row of calculated values each of which is indicative of the presence or absence of a response from a polled meter.

5. The method of claim 4 further including adjusting the predetermined values for line noise.

6. The method of claim 5 further including comparing each adjusted value to a predetermined value whereby if the adjusted value exceeds the predetermined value then one status at the location of the meter is indicated, but if the adjusted value is less than the predetermined value it is indicative of a different status at the location of the meter.

7. The method of claim 1 in which the only information conveyed by each bit pattern is the presence or absence of an alarm condition at the location of each meter polled.

8. The method of claim 1 in which the information conveyed by each bit pattern is the occurrence of a power outage at the location of each polled meter and the presence or absence of an alarm condition at the location of each polled meter.

9. The method of claim 1 in which the query and reply signals sent to and from each polled meter are sent and received by a TWACS.

10. In a TWACS system used to communicate over power lines of an electric distribution network, a method for simultaneously polling a plurality of electrical meters located at premises to which electricity is supplied through the system to determine if a power outage has occurred at a location within the system comprising:
    transmitting an outbound TWACS signal over a power line to poll each meter comprising a group of meters to which the outbound signal is sent;
    all of the meters in the group simultaneously sending an inbound TWACS reply signal back to the transmission site over the power line, each separate inbound signal having a predetermined bit pattern of N bits in length with the bit pattern for each meter being a unique bit pattern that is non-interfering with all of the other bit patterns sent by all of the other meters, the bit patterns being orthogonal bit patterns derived from a Hadamard matrix in which all the rows are orthogonal to each other; and,
    receiving the inbound signals and processing the bit patterns comprising each inbound signal to determine if an outage has occurred at the location of any of the polled meters.

11. The method of claim 10 in which the presence of a polled meter is indicated by the presence of the bit pattern in the reply signal, and the absence of a polled meter is indicated by the absence of the bit pattern in the reply signal.

12. The method of claim 10 wherein receiving and processing the inbound signals includes code division time-multiplexing with any noise on a line over which a reply signal is sent being averaged over the length of the signal.

13. The method of claim 10 in which values in the Hadamard matrix are combined with values derived from the inbound signals from the meters to generate a set of calculated values each of which is indicative of the presence or absence of a meter at each location where a meter was polled.

14. The method of claim 13 further including comparing each adjusted value to a predetermined value whereby if the adjusted value exceeds the predetermined value then no power outage at the location of the polled meter is indicated, but if the adjusted value is less than the predetermined value it is indicative of a power outage at the location of the polled meter.

15. The method of claim 10 in which the information conveyed by each bit pattern further includes the presence or absence of an alarm condition at the location of each polled meter.

16. A method for simultaneously polling a plurality of electrical meters located at premises to which electricity is supplied through an electrical distribution network, using TWACS, to determine if a power outage has occurred at a location within the system comprising:
transmitting an outbound TWACS signal over a power line to poll each meter comprising a group of meters to which the outbound signal is sent;
all of the meters in the group simultaneously sending an inbound TWACS signal back to the transmission site over the power line, each separate inbound signal having a predetermined bit pattern of N bits in length with the bit pattern for each meter being a unique bit pattern that is non-interfering with all of the other bit patterns sent by all of the other meters, the bit patterns being orthogonal bit patterns derived from a Hadamard matrix in which all the rows are orthogonal to each other; and,
receiving the inbound signals and processing the bit patterns comprising each inbound signal to determine if an outage has occurred at the location of any polled meter, receiving and processing inbound signals includes code division multiplexing, with any noise on a line over which a reply signal is sent being averaged over the length of the signal.

17. The method of claim 16 in which the values in the Hadamard matrix are combined with values derived from the inbound signals from the meters to generate a set of calculated values each of which is indicative of the presence or absence of a meter at each location where a meter was polled.

18. The method of claim 17 in which the calculated values are adjusted for noise and each adjusted value is compared to a predetermined value whereby if the adjusted value exceeds the predetermined value then no power outage at the location of the polled meter is indicated, but if the adjusted value is less than the predetermined value it is indicative of a power outage at the location of the polled meter.

19. The method of claim 16 in which the presence of a polled meter is indicated by the presence of the bit pattern in the reply signal, and the absence of a polled meter is indicated by the absence of the bit pattern in the reply signal.

20. The method of claim 16 in which the information conveyed by each bit pattern further includes the presence or absence of an alarm condition at the location of each polled meter.

21. A method for simultaneously polling a plurality of electrical meters located at premises to which electricity is supplied through an electrical distribution system to determine the status at a location within the system comprising:
transmitting a query signal from a transmission site over a power line to poll each meter comprising a group of meters to which a query signal is sent;
all of the meters in the group simultaneously sending a reply signal back to the transmission site over the power line, each separate reply signal having a predetermined bit pattern N bits in length, the bit pattern for each meter being a unique bit pattern that is non-interfering with all of the other bit patterns sent by all of the other meters; and,
receiving the reply signals and processing the bit patterns comprising each reply signal to determine the status at each location of a polled meter, processing the bit patterns including:
calculating a value represented by the bit pattern in the reply signal;
comparing the calculated value against a predetermined threshold value whereby if the value exceeds the predetermined value one status of the meter is indicated, but if the value is less than the predetermined value another status of the meter is indicated, and,
adjusting the predetermined value to reduce false positive or false negative results from the comparison.

22. The method of claim 21 further including adjusting the predetermined value for line noise.

23. The method of claim 21 in which the reply signal further includes information as to whether or not an alarm condition exists at the meter.

* * * * *